United States Patent [19]
Noh

[11] Patent Number: 6,097,513
[45] Date of Patent: Aug. 1, 2000

[54] HOLOGRAPHIC MEMORY DEVICE

[75] Inventor: Sung Woo Noh, Kyungki-do, Rep. of Korea

[73] Assignee: LG Electronics Inc., Seoul, Rep. of Korea

[21] Appl. No.: 09/200,926

[22] Filed: Nov. 30, 1998

[30] Foreign Application Priority Data

Dec. 1, 1997 [KR] Rep. of Korea ............ 97/65030

[51] Int. Cl.[7] .................. G03H 1/10; G03H 1/12; G03H 1/26; G03H 1/04
[52] U.S. Cl. .................. 359/10; 359/1; 359/11; 359/22; 359/35
[58] Field of Search .................. 359/10, 11, 35, 359/17, 22

[56] References Cited

U.S. PATENT DOCUMENTS

| | | | |
|---|---|---|---|
| 3,492,652 | 1/1970 | Heerden | 359/10 |
| 4,054,357 | 10/1977 | Lurie | 359/22 |

Primary Examiner—Audrey Chang
Attorney, Agent, or Firm—Fleshner & Kim, LLP

[57] ABSTRACT

A holographic memory device includes: a hologram memory part for information recording by using a reference beam and an object beam, the hologram memory part having a plurality of cells; a first optical path modifying part having a fine adjustment element that adjusts the reference beam's path so as to be incident on the hologram memory part at a specific angle for information recording and reconstructing, and that adjusts the reference beam's path so as to be incident on the hologram memory part at a desired angle for information reconstructing when an angle of incidence of reference beam for information reconstructing doesn't coincide with that of reference beam for information recording; and a second optical path modifying part that adjusts the object beam's path so as to be incident on the hologram memory part for information recording. Even though physical shaking occurs on recording medium or the recording medium is replaced after information recording on the hologram memory part, the information recorded can be accurately reconstructed.

9 Claims, 4 Drawing Sheets

HOLOGRAPHIC MEMORY DEVICE

BACKGROUND OF THE INVENTION

1. Field of the Invention

The present invention relates to a holographic memory device.

2. Description of the Related Art

In recent years, as the demand for recording and later reconstructing the large-sized information is increasing, optical information recording/reconstructing technique using holography, a method of three-dimensional optical image formation, has been developed other than two-dimensional recording/reconstructing devices using optical disk recording media such as CDs, DVDs, etc.

Referring to FIG. 1 showing an information recording/reconstructing apparatus using holography, a laser 1 is used as a light source, and a beam splitter 14 is used to divide a beam 16 from laser 15 into a reference beam 12 and an object beam 7.

The reference beam 12 enters a beam deflector 11 which changes the direction of reference beam 12 by reflection or refraction, in order to allow reference beam 12 to be a reflected beam 13.

The reflected beam 13 goes to a telescope 9 of 1:1 in magnification.

An axis of telescope 9 coincides with a predetermined optical axis 21, and the reflected beam 13 is incident on the telescope 9 at a specific angle A1 20 with respect to optical axis 21.

After passing through the telescope 9, the reflected beam 13 is changed into an incident reference beam 6, and then goes to a recording medium 3. Here, the direction of incident reference beam 6 is opposed to that A1 20 of reflected beam 13 with respect to optical axis 21, and the absolute value of incident angle A2 19 of reference beam 6 is the same as the angle A1 20.

When an axis 18 of recording medium 3 coincides with the optical axis 21, the incident reference beam 6 enters the recording medium 3 at an angle of incidence A2 19.

The beam deflector 11 is controlled to adjust the angle A1 20.

A computer 8 controls the beam deflector 11 to adjust the angle A1 20 of reflected beam 13. Therefore, the angle of incidence A2 19 of incident reference beam 6 incident on the recording medium 3 is also controlled by computer 8.

After passing through a shutter 17 for controlling the traveling of beam 16, a reflecting mirror 10 for changing the traveling direction of beam 7, a spatial light modulator (SLM) 1 for presenting the information, and a Fourier transform lens (FTL) 2 for generating an image by Fourier transforming the image displayed on SLM 1, the object beam 7 enters the recording medium 3, in the form of incident object beam 7'. The incident reference beam 6 and the incident object beam 7' meet each other in the recording medium 3.

A collecting lens 4 is on a position spaced a given distance away from recording medium 3 in the traveling direction of object beam 7. A charge coupled device (CCD) 5 is positioned on collecting lens 4's collecting side to change the image of SLM 1 into an electrical signal, and SLM 1 and CCD 5 are controlled by computer 8.

The following description will now relate to the information recording operation of holographic memory.

When the information to be recorded in SLM 1 is displayed by computer 8 and the object beam 7 is incident on recording medium 3, the information displayed on SLM 1 is transformed by FTL 2 so that object beam 7' incident on recording medium 3 holds the Fourier transformed information of SLM 1.

When incident reference beam 6 and incident object beam 7' go to recording medium 3, the pattern of interference between these beams is recorded on recording medium 3.

Another information is displayed on SLM 1, to be recorded on recording medium 3, and the beam deflector 11 is adjusted to change the angle of incidence A2 19 of incident reference beam 6 into A2'.

After passing through SLM 1, incident object beam 27 goes to the recording medium 3 at the same angle as the incident object beam 7', but holds the information different from the previous information due to the different information of SLM 1. The pattern of interference between incident object beam 27 and incident reference beam 6 slightly different from each other in angle of incidence is recorded on recording medium 3.

Several pieces of information can be recorded on recording medium 3 by changing the angle of incidence 19 of incident reference beam 6 in this way.

In operation of reconstructing the information recorded in the above-mentioned way, as object beam 7 is cut off by shutter 17, and reference beam 6 is incident on recording medium 3 at the same angle of incidence as the specific angle of incidence A2 19, reference beam 6 is diffracted by the interference pattern recorded on recording medium 3, and reconstructed object beam 7" traveling toward CCD 5 is created. When this reconstructed object beam 7" is collected on CCD 5 with lens 4, computer 8 stores and analyzes an electrical signal from CCD 5.

When incident reference beam 6 enters with the angle of incidence A2 ' changed from its original angle of incidence A2 19, a reconstructed object beam 7" corresponding to this is generated.

In this way, the information stored on recording medium 3 can be reconstructed.

As reference beam 6 goes to the recording medium 3 where information is recorded, only the pattern of interference, created by object beam 7 and reference beam 6 whose angle of incidence is the same as that of reference beam used at the time of recording, satisfies Bragg's law to reproduce a single object beam. That is, object beam may be selectively reconstructed by controlling the angle of incidence A2 19 of reference beam 6.

In general, variation in angle of incidence A2 19 for another information recording is about 0.01°.

Reference beam 6 having an error not exceeding 0.001° from desired angle A1 20, incident for original information recording, satisfies Bragg's law to generate a reconstructed object beam, etc.

The beam deflector 11 is constructed such that the incident reference beam 6 is incident at a predetermined angle A2, A2' maintaining planned accuracy (normally within 0.001°).

However, when physical shaking occurs on recording medium 3 or the recording medium 3 is replaced after recording, recording medium 3' deviates from its original position and its axis 18' is changed from the original axis 18, as shown in FIG. 2.

In this case, an angle 19' that the incident reference beam 6 makes with the recording medium's axis 18' is also changed from original angle 19. In general, if its errors equals 19'−19>0.001° (whereas S denotes error, 19' denotes the angle that the incident reference beam makes with the recording medium's axis 18', and 19 denotes the original angle that the incident reference beam makes with original recording medium's axis 18), desired information isn't reconstructed.

In that case, it is unavoidable to control the beam deflector 11. When the minimum control step of beam deflector 11 is larger than the above-mentioned expression S, however, it is impossible to control the beam deflector 11.

Because the minimum control step of beam deflector 11 is the variation in angles of incidence A2 and A2', namely about 0.01°, the beam deflector 11 is in common use and has a disadvantage in case of frequent recording medium replacement.

In case the recording medium is replaced quite often, the beam deflector alone can't control the angle of incident reference beam with desired accuracy, thus not allowing the reconstruction of the desired information.

SUMMARY OF THE INVENTION

Accordingly, the present invention is directed to a holographic memory device that substantially obviates one or more of the limitations and disadvantages of the related art.

An object of the present invention is to provide a holographic memory device which accurately reconstructs the desired information even in case of physical shaking or recording medium replacement.

Additional features and advantages of the invention will be set forth in the description which follows, and in part will be apparent from the description, or may be learned by practice of the invention. The objectives and other advantages of the invention will be realized and attained by the structure as illustrated in the written description and claims hereof, as well as the appended drawings.

To achieve these and other advantages, and in accordance with the purpose of the present invention as embodied and broadly described, the present invention discloses a holographic memory device including: a hologram memory part for information recording by using a reference beam and an object beam, the hologram memory part having a plurality of cells; a first optical path modifying part having a fine adjustment element that adjusts the reference beam's path so as to be incident on the hologram memory part at a specific angle for information recording and reconstructing, and that adjusts the reference beam's path so as to be incident on the hologram memory part at a desired angle for information reconstruction when an angle of incidence of reference beam for information reconstruction doesn't coincide with that of reference beam for information recording; and a second optical path modifying part that adjusts the object beam's path so as to be incident on the hologram memory part for information recording.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF PREFERRED EMBODIMENT

Reference will now be made in detail to the preferred embodiments of the present invention, examples of which are illustrated in the accompanying drawings.

Figure 1:
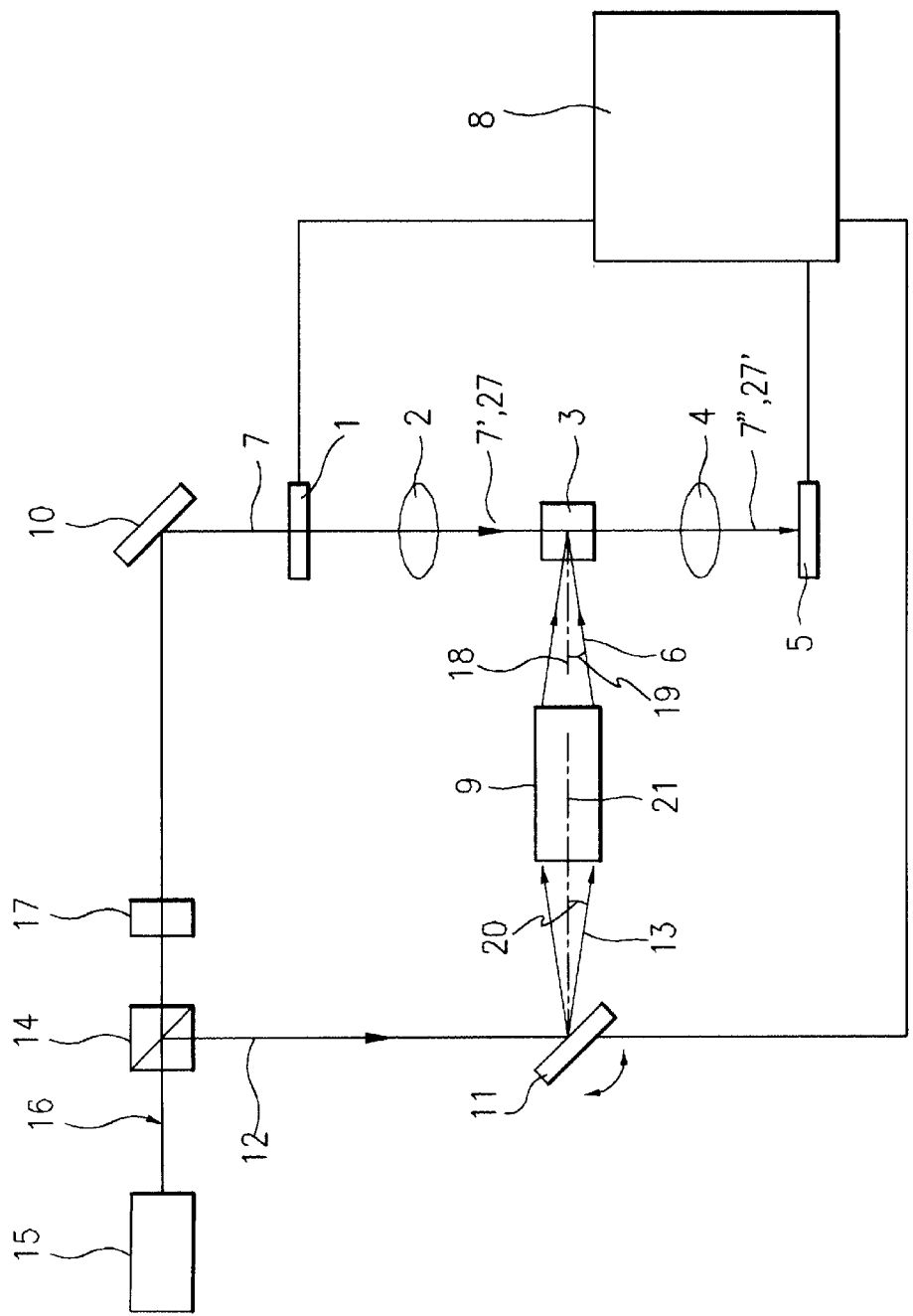
FIG. 1 is a diagram showing a construction of a conventional holographic memory device.
Figure 2:
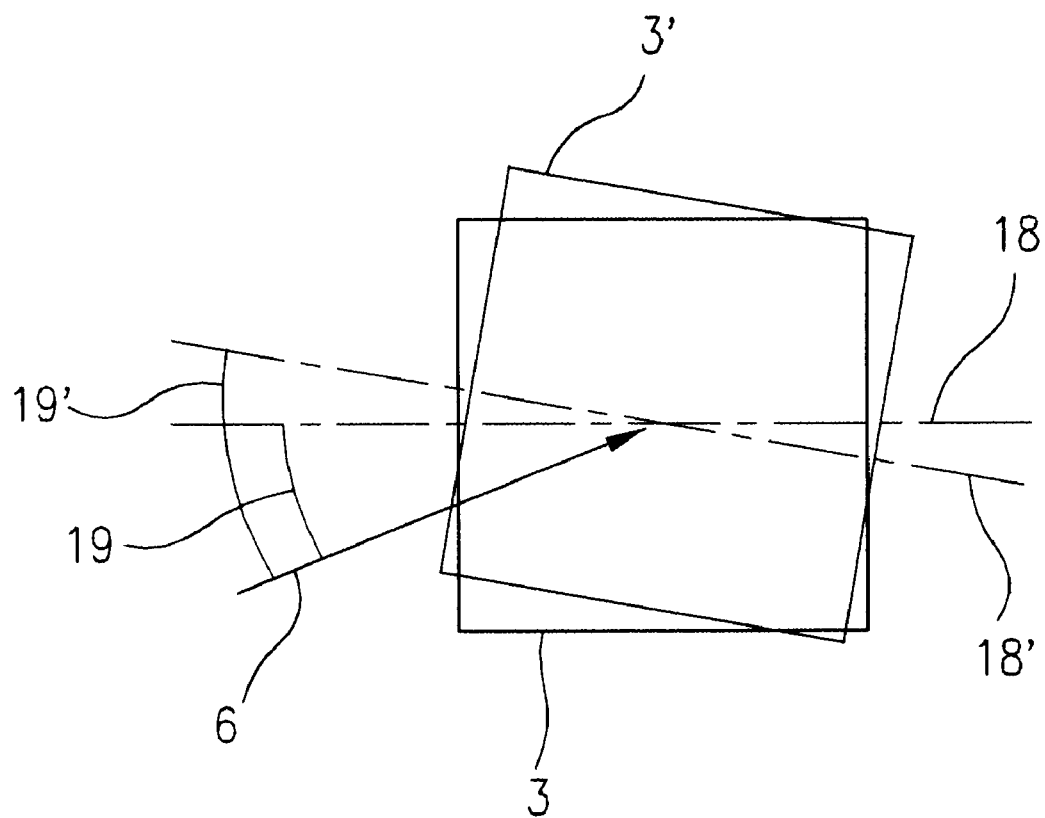
FIG. 2 depicts an angle of incidence of an incident beam when a position of a recording medium is changed.
Figure 3:
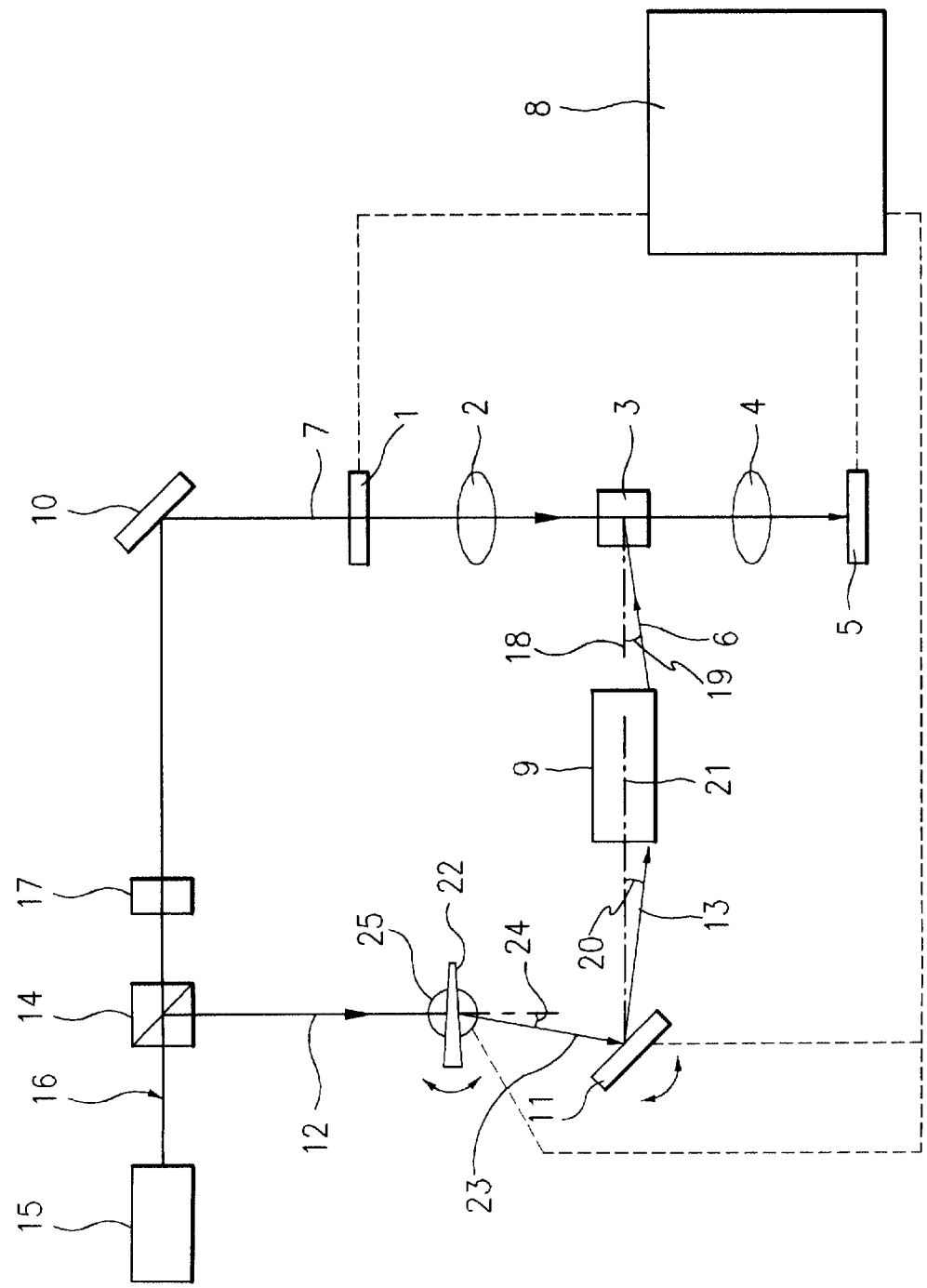
FIG. 3 is a diagram showing a construction of a holographic memory device according to the present invention.

As shown in FIG. 3, a construction of a holographic memory device according to the present invention is in general identical with that of a holographic memory device shown in FIG. 1. However, a reference beam 12 passes through a fine adjustment element 22, to be a refracted beam 23, before entering a beam deflector 11.

Figure 4:
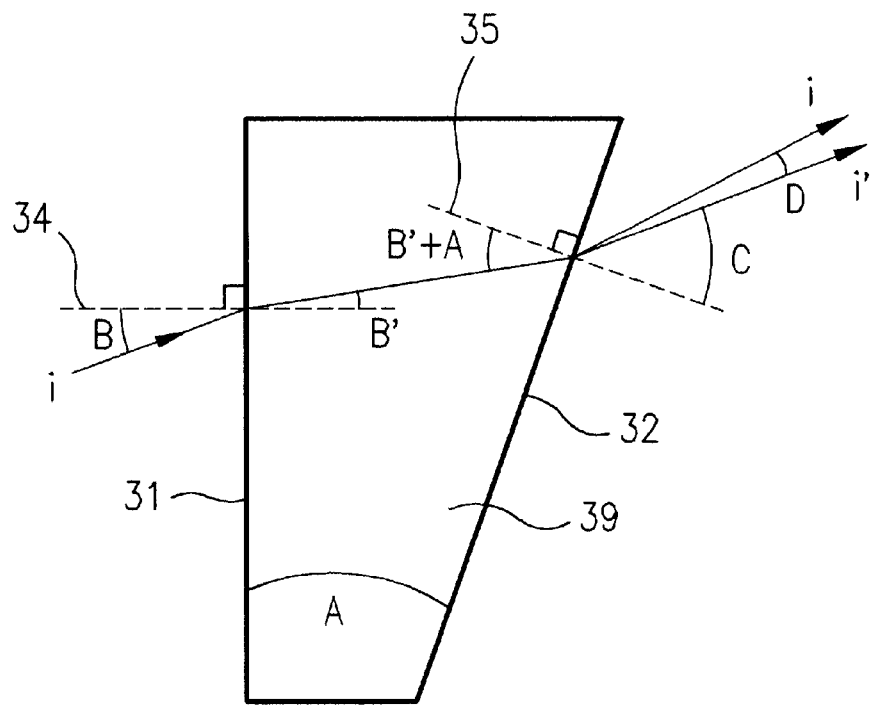
FIG. 4 shows a wedge element according to the present invention.
Figure 5:
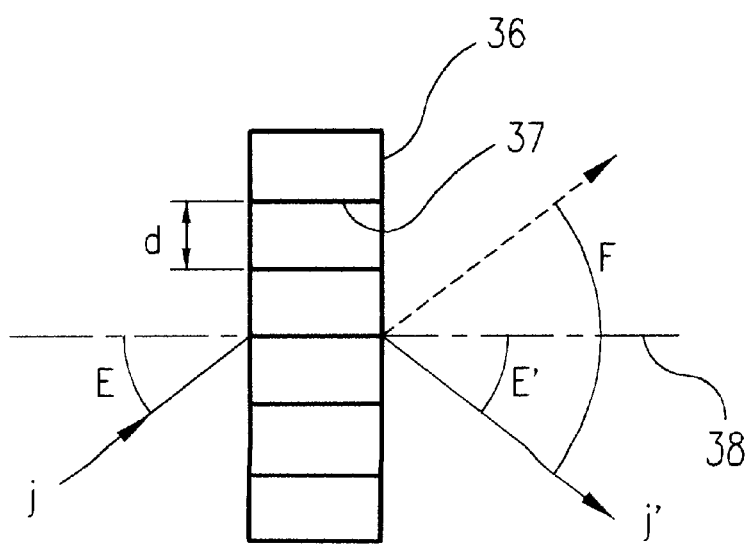
FIG. 5 illustrates a diffraction grating according to the present invention.

The fine adjustment element 22 consists of a wedge element 39 of FIG. 4 or diffraction grating 36 of FIG. 5, and its swivelling angle is adjusted by a swivelling means 25 that is connected to and controlled by a computer 8.

The fine adjustment element 22 serves to accurately reconstruct the information recorded in a recording medium 3 even in case of recording medium replacement or disturbance.

That is, when the recording medium 3 is replaced or disturbance occurs, the computer 8 controls the beam deflector 11 and allows a reflected beam 13 to enter a telescope 9 at an angle of incidence A1 20, so as to construct a predetermined reconstructed beam 7" (for example, reconstructed beam that corresponds to a first page of information recorded reiteratively in recording medium).

When an optical axis 18 of recording medium 3 is changed, however, an incident reference beam 19 enters the recording medium 3 at a different angle from an angle of incidence A2 19 originally aimed.

As a result, the computer 8 can't receive through CCD 5 the reconstructed beam 7" originally aimed.

Here, the computer 8 lets the swivelling means 25 operate to turn the fine adjustment element 22, not actuating the beam deflector 11.

The refracted beam 23 goes to the beam deflector 11, with its angle of refraction 24 altered finely according to a swivelling movement of fine adjustment element 22. In this connection, the incidence angle A2 19 of an incident reference beam 6 is adjusted to cause an accurate reconstruction of the reconstructed beam 7".

The following description will relate in detail to the fine adjustment element of the present invention, with reference to the preferred embodiments.

The operational principle of fine adjustment element in the form of a wedge element is explained in FIG. 4.

The wedge element 39 is an optical element made of optical glass, that consists of two planes 31 and 32 not parallel with each other.

In case an angle between the two planes is referred to as A, and an incident beam i enters with respect to an incident plane 31 at the angle B, an angle C that a refracted beam i' coming from one plane 32 makes with a vertical line 35 of one plane 32 is $$C = \arcsin(N \cdot \sin(B' + A))$$

wherein, $B' = \arcsin(1/N \cdot \sin B)$, N is glass' refractive index.

Therefore, the angle of refraction D) (24 shown in FIG. 3) which the refracted beam i' and incident beam i make with each other equals B+A−C.

For example, when the refractive index n equals 1.5, the angle A between two planes equals 1°, and the angle of incidence B equals 0°, the angle of refraction D1 equals −0.500°.

When the swivelling means 25 is adjusted to allow the fine adjustment element 22 to be rotated 2 degrees, thereby making the angle of incidence B 2°, D2 equals −0.501°.

Accordingly, the angle of refraction 24 can be adjusted with desired accuracy by variation in angle of refraction (D1−D2=0.001°).

The operational principle of a diffraction grating as the fine adjustment element is shown in FIG. 5.

Diffraction grating 36 encompasses fringes 37 of uniform spacing d.

When an incident beam j with angle of incidence E enters a vertical line 38 of diffraction grating, a diffracted beam j' is generated by the principle of diffraction.

Here, the following expression is found between the angle of incidence E and the angle of diffraction E', $$d = \lambda/(\sin E' + \sin E)$$

whereas, λ equals a wavelength of a laser beam.

A difference between the angle of incidence and the angle of diffraction, namely the angle of refraction F can be obtained by the expression.

For instance, when a laser beam goes at the angle of incidence of 4° to the diffraction grating (λ=0.532 μm, d=3.813 μm), the angle of diffraction E' equals 4° and the angle of refraction F1 equals 8°.

When the diffraction grating is rotated 1 degree, to make the angle of incidence E 5°, the angle of diffraction E' is 3.0010 and the angle of refraction F2 is 8.001° by the above-mentioned expression.

In this connection, the variation in angle of refraction (F2−F1=0.001°) causes an accurate adjustment.

As described above, even though physical shaking occurs on recording medium or the recording medium is replaced after recording, the information recorded can be accurately reconstructed.

It will be apparent to those skilled in the art that various modifications and variations can be made in a holographic memory device of the present invention without deviating from the spirit or scope of the invention. Thus, it is intended that the present invention cover the modifications and variations of this invention provided they come within the scope of the appended claims and their equivalents.

What is claimed is:

1. A holographic memory device comprising:
    a light source for generating a beam;
    a beam splitter for dividing the beam into a reference beam and an object beam;
    a hologram memory part including a plurality of cells, that records corresponding information on the cells when both the reference beam and the object beam are incident thereon, and that reconstructs information recorded previously when only the reference beam is incident thereon;
    a first beam deflector that directs the reference beam towards the hologram memory part;
    a fine adjustment element that receives the reference beam, and that swivels to finely and accurately adjust the reference beam's path so as to be incident on the hologram memory part at a desired angle for information reconstructing when an angle of incidence of the reference beam for information reconstructing does not coincide with that of the reference beam for information recording, wherein the fine adjustment element has a minimum control step of no more than 0.001 degrees;
    a second beam deflector that directs the object beam towards the hologram memory part; and
    swiveling means, connected to and controlled by a computer, for adjusting a swiveling angle of the fine adjustment element.

2. A holographic memory device according to claim 1, wherein the fine adjustment element consists of a wedge element or diffraction grating.

3. A holographic memory device according to claim 1, wherein the second beam reflector includes:
    a shutter for allowing the incident object beam to pass therethrough during recording, and for cutting off the incident object beam during reconstruction; and
    a reflecting mirror for changing the traveling direction of the object beam that passed the shutter.

4. A holographic memory device according to claim 3, further comprising:
    a beam modulator that presents the incident object beam; and
    a lens that Fourier-transforms and generates the object beam displayed on the beam modulator.

5. A holographic memory device comprising:
    a light source for generating a beam;
    a beam splitter for dividing the beam into a reference beam and an object beam;
    a hologram memory part including a plurality of cells, that records corresponding information on the cells when both the reference beam and the object beam are incident thereon, and that reconstructs information recorded previously when only the reference beam is incident thereon;
    a fine adjustment element that refracts or diffracts the reference beam divided by the beam splitter, and that swivels to finely and accurately adjust the reference beam to be incident at a desired angle during information reconstruction, wherein the fine adjustment element has a minimum control step of no more than 0.001 degrees;
    a beam deflector that directs the reference beam incident from the fine adjustment element towards the hologram memory part;
    a shutter for allowing the object beam divided by the beam splitter to pass there through during recording, and for cutting off the object beam during reconstruction;
    a reflecting mirror for changing the traveling direction of the object beam that passed the shutter;
    a beam modulator that presents the object beam incident from the reflecting mirror;
    a lens that Fourier-transforms the object beam displayed on the beam modulator, before letting it enter the hologram memory part;

a beam detector for converting the optical information reconstructed in the hologram part into an electric signal during reconstruction; and swiveling means, connected to and controlled by a computer, for adjusting a swivel angle of the fine adjustment element.

6. A holographic memory device according to claim 5, wherein the fine adjustment element consists of a wedge element or diffraction grating.

7. A holographic memory device comprising:

a hologram memory part that records information when a reference beam and an object beam are incident thereon, and reconstructs information recorded previously when only the reference beam is incident thereon;

a beam deflector that directs the reference beam towards the hologram memory part;

a fine adjustment element that refracts or diffracts the reference beam, and that swivels to finely adjust the reference beam's path so as to be incident on the hologram memory part at an angle required for information reconstructing, wherein the fine adjustment element has a minimum control step of no more than 0.001 degrees; and a swiveler that adjusts a swiveling angle of the fine adjustment element.

8. A holographic memory device according to claim 7, wherein the fine adjustment element comprises an optical wedge.

9. A holographic memory device according to claim 7, wherein the fine adjustment element comprises a diffraction grating.

* * * * *